(12) United States Patent
Yang et al.

(10) Patent No.: US 8,906,455 B2
(45) Date of Patent: Dec. 9, 2014

(54) LOW TEMPERATURE DEPOSITION OF SILICON-CONTAINING FILMS

(71) Applicants: Liu Yang, Yorba Linda, CA (US); Xinjian Lei, Vista, CA (US); Bing Han, Lansdale, PA (US); Manchao Xiao, San Diego, CA (US); Eugene Joseph Karwacki, Jr., Orefield, PA (US); Hansong Cheng, Allentown, PA (US)

(72) Inventors: Liu Yang, Yorba Linda, CA (US); Xinjian Lei, Vista, CA (US); Bing Han, Lansdale, PA (US); Manchao Xiao, San Diego, CA (US); Eugene Joseph Karwacki, Jr., Orefield, PA (US); Hansong Cheng, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/624,190

(22) Filed: Sep. 21, 2012

(65) Prior Publication Data

US 2013/0189853 A1 Jul. 25, 2013

Related U.S. Application Data

(62) Division of application No. 12/476,734, filed on Jun. 2, 2009, now Pat. No. 8,298,628.

(60) Provisional application No. 61/057,891, filed on Jun. 2, 2008, provisional application No. 61/058,374, filed on Jun. 3, 2008.

(51) Int. Cl.
| | |
|---|---|
| *C23C 16/00* | (2006.01) |
| *H01L 21/02* | (2006.01) |
| *H01L 21/316* | (2006.01) |
| *H01L 21/318* | (2006.01) |
| *C23C 16/34* | (2006.01) |
| *H01L 21/314* | (2006.01) |
| *C23C 16/40* | (2006.01) |
| *C23C 16/455* | (2006.01) |
| *C23C 16/30* | (2006.01) |

(52) U.S. Cl.
CPC .... *H01L 21/02271* (2013.01); *H01L 21/02164* (2013.01); *H01L 21/02126* (2013.01);
(Continued)

(58) Field of Classification Search
None
See application file for complete search history.

(56) References Cited

U.S. PATENT DOCUMENTS

| 5,976,991 A | 11/1999 | Laxman et al. |
| 6,180,809 B1 | 1/2001 | Pillot et al. |

(Continued)

FOREIGN PATENT DOCUMENTS

| EP | 1 967 609 A2 | 9/2008 |
| JP | 02-166281 | 6/1990 |

(Continued)

OTHER PUBLICATIONS

J. Gumpher, W. Bather, N. Mehta and D. Wedel, Characterization of Low-Temperature Silicon Nitride LPCVD from Bis(tertiary-butylamino)silane and Ammonia, Journal of The Electrochemical Society, 2004, G353-G359, 151.

(Continued)

*Primary Examiner* — Joseph Miller, Jr.
(74) *Attorney, Agent, or Firm* — Rosaleen P. Morris-Oskanian; Lina Yang

(57) ABSTRACT

This invention discloses the method of forming silicon nitride, silicon oxynitride, silicon oxide, carbon-doped silicon nitride, carbon-doped silicon oxide and carbon-doped oxynitride films at low deposition temperatures. The silicon containing precursors used for the deposition are monochlorosilane (MCS) and monochloroalkylsilanes. The method is preferably carried out by using plasma enhanced atomic layer deposition, plasma enhanced chemical vapor deposition, and plasma enhanced cyclic chemical vapor deposition.

16 Claims, 2 Drawing Sheets

(52) U.S. Cl.
CPC .... *H01L 21/31608* (2013.01); *H01L 21/31633* (2013.01); *H01L 21/0228* (2013.01); *H01L 21/3185* (2013.01); *H01L 21/02274* (2013.01); *H01L 21/0217* (2013.01); *C23C 16/345* (2013.01); *H01L 21/3145* (2013.01); *H01L 21/02211* (2013.01); *C23C 16/401* (2013.01); *C23C 16/45536* (2013.01); *C23C 16/308* (2013.01); *H01L 21/0214* (2013.01)
USPC ........ 427/248.1; 556/487; 438/786; 438/787; 438/791

(56) References Cited

U.S. PATENT DOCUMENTS

| | | | |
|---|---|---|---|
| 6,391,803 | B1 | 5/2002 | Kim et al. |
| 6,407,013 | B1 | 6/2002 | Li et al. |
| 6,667,236 | B2 | 12/2003 | Meijer et al. |
| 6,992,019 | B2 | 1/2006 | Lee et al. |
| 7,071,117 | B2 | 7/2006 | Powell |
| 7,084,076 | B2 | 8/2006 | Park et al. |
| 7,094,708 | B2 | 8/2006 | Kato et al. |
| 7,119,016 | B2 | 10/2006 | Chakravarti et al. |
| 7,494,937 | B2 | 2/2009 | Clark |
| 7,531,452 | B2 | 5/2009 | Clark |
| 7,651,961 | B2 | 1/2010 | Clark |
| 7,939,455 | B2 | 5/2011 | Clark |
| 2001/0023121 | A1* | 9/2001 | Meijer et al. .......... 438/586 |
| 2001/0041250 | A1* | 11/2001 | Werkhoven et al. .......... 428/212 |
| 2002/0018849 | A1 | 2/2002 | George et al. |
| 2002/0086541 | A1 | 7/2002 | Fu et al. |
| 2002/0119327 | A1 | 8/2002 | Arkles et al. |
| 2002/0164890 | A1 | 11/2002 | Kwan et al. |
| 2003/0059535 | A1 | 3/2003 | Luo et al. |
| 2004/0026037 | A1 | 2/2004 | Shinriki et al. |
| 2004/0256664 | A1 | 12/2004 | Chou et al. |
| 2005/0085054 | A1 | 4/2005 | Chakravarti et al. |
| 2005/0145177 | A1 | 7/2005 | McSwiney et al. |
| 2005/0181633 | A1 | 8/2005 | Hochberg et al. |
| 2005/0191866 | A1 | 9/2005 | Powell |
| 2006/0148269 | A1 | 7/2006 | Powell |
| 2006/0178019 | A1 | 8/2006 | Senzaki et al. |
| 2006/0180879 | A1 | 8/2006 | Maes et al. |
| 2007/0111545 | A1 | 5/2007 | Lee et al. |
| 2007/0234957 | A1 | 10/2007 | Lee et al. |
| 2007/0292974 | A1 | 12/2007 | Mizuno et al. |
| 2008/0081470 | A1 | 4/2008 | Clark |
| 2008/0242116 | A1 | 10/2008 | Clark |

FOREIGN PATENT DOCUMENTS

| | | |
|---|---|---|
| JP | 04-233733 | 8/1992 |
| JP | 07-193129 | 7/1995 |
| JP | 08-148481 | 6/1996 |
| JP | 2002-151489 | 5/2002 |
| JP | 2003528467 A | 9/2003 |
| JP | 2004-022595 A | 1/2004 |
| JP | 2004179196 | 6/2004 |
| JP | 2004186210 | 7/2004 |
| JP | 2005-011904 | 1/2005 |
| JP | 2005-057133 A | 3/2005 |
| JP | 2008-507845 | 3/2008 |
| JP | 2008-511993 | 4/2008 |
| KR | 20060003211 | 1/2006 |
| KR | 10-0676521 | 2/2007 |
| WO | 01/71801 A1 | 9/2001 |
| WO | 2004044958 | 5/2004 |
| WO | 2006/026350 | 3/2006 |
| WO | 2006/033699 | 3/2006 |
| WO | 2007/106502 A2 | 9/2007 |

OTHER PUBLICATIONS

S. Kamiyama, T. Miura and Y. Nara, Comparison between SiO2 films deposited by atomic layer deposition with SiH2[N(CH3)2]2 and SiH[N(CH3)2]3 precursors, Thin Solid Films, 2006, 1517-1521, 515.

A. Korkin, J. Cole, D. Sengupta and J. Adams, On the Mechanism of Silicon Nitride Chemical Vapor Deposition from Dichlorosilane and Ammonia, Journal of The Electrochemical Society, 1999, 4203-4212, 146.

D. O'Meara, K. Hasebe, A. Dip, S. Maku, K. Matsushita, R. Mo, P. Higgins, M. Chudzik, M. Gribelyuuk and L. Tai, Silicon Nitride Molecular Layer Deposition Process Development Using Dichlorosilane and Ammonia, The Electrochemical Society, 2007, 51-59, 3.

D. Teasdale, Y. Senzaki, R. Herring, G. Hoeye, L. Page and P. Schubert, LPCVD of Silicon Nitride from Dichlorosilane and Ammonia by Single Wafer Rapid Thermal Processing, Electrochemical and Solid-State Letters, 2001, F11-F12, 4.

S. Walch and C. Dateo, Thermal Decomposition Pathways and Rates for Silane, Chlorosilane, Dichlorosilane, and Trichlorosilane, J. Phys. Chem., 2001, 2015-2022, 105.

K. Watanabe, T. Tanigaki and S. Wakayama, The Properties of LPCVD SiO2 Film Deposited by SiH2Cl2 and N2O Mixtures, Journal of the Electrochemical Society, 1981, 2630-2635, 128.

S. Yokoyama, N. Ikeda, K. Kajikawa, Y. Nakashima, Atomic-layer selective deposition of silicon nitride on hydrogen-terminated Si surfaces, Applied Surface Science, 1998, 352-356, 130-132.

J. Lee, U. Kim, C. Han, S. Rha, W. Lee, and C. Park, Investigation of Silicon Oxide Thin Films Prepared by Atomic Layer Deposition Using SiH2Cl2 and O3 as the Precursors, Japanese Journal of Applied Physics, 2004, L328-L330.

* cited by examiner

LOW TEMPERATURE DEPOSITION OF SILICON-CONTAINING FILMS

CROSS-REFERENCE TO RELATED APPLICATIONS

This application is a divisional application of U.S. application Ser. No. 12/476,734, filed Jun. 2, 2009; which claimed benefit of U.S. Provisional Application No. 61/057,891, filed Jun. 2, 2008 and U.S. Provisional Application No. 61/058,374, filed Jun. 3, 2008. The disclosures of those applications are hereby incorporated by reference.

BACKGROUND OF THE INVENTION

Thin films of silicon nitride have been widely used in various applications due to their unique physical, chemical and mechanical properties. In semiconductor devices particularly, silicon nitride films are used as gate insulations, diffusion masks, sidewall spacers, passivation and encapsulation, etc. Typically, silicon nitride films used in the Front End of Line (FEOL) are currently deposited by Low pressure chemical vapor deposition (LPCVD) in a hot wall reactor at >750° C. using dichlorosilane and ammonia. As the lateral and vertical dimensions of Integrate Circuit (IC) continue to shrink, however, there is an increasing demand for silicon nitride films to be deposited at much lower temperatures (<550° C.) in order to avoid unwanted reaction between Si and metal, and realize ultra-high integration devices with precise doping profile control.

To grow silicon nitride films at low temperatures, recently, there have been reports that the addition of small amount Ge may lead to the reduction of required deposition temperature for silicon nitride films (U.S. Pat. No. 7,119,016 B2). But this may introduce unwanted impurity to the film, causing reliability issues for the devices that the film is suited for, and may also increase the complexity of the deposition process and cost.

Recent innovations to improve complementary metal oxide semiconductor (CMOS) transistor performance have created an industry need for strained ceramic layers compatible with current ultra-large scale integration (ULSI) techniques. In particular, channel carrier mobility for negative metal oxide semiconductor (NMOS) transistors can be increased through introduction of tensile uniaxial or biaxial strain on a channel region of the MOS transistor. Similarly, compressively strained films can be used to realize an enhancement in channel carrier mobility for positive metal oxide semiconductor (PMOS) transistors. In U.S. Publication 2008/0081470A1, a method for forming a strained SiN film and a semiconductor device containing the strained SiN film is disclosed.

BRIEF SUMMARY OF THE INVENTION

The current invention discloses the method of depositing silicon nitride, silicon oxynitride, silicon oxide, carbon-doped silicon nitride, carbon-doped silicon oxide and carbon-doped oxynitride films at low deposition temperatures. The silicon containing precursors used for the deposition are monochlorosilane (MCS) and monochloroalkylsilanes.

In accordance with one embodiment, the present invention relates to a process to deposit silicon nitride or carbon-doped silicon nitride on a substrate in a processing chamber, comprising:

a. contacting the substrate with a nitrogen-containing source to absorb at least a portion of the nitrogen-containing source on the substrate;
b. purging unabsorbed nitrogen-containing source;
c. contacting the substrate with a silicon-containing precursor to react with the portion of the absorbed nitrogen-containing source; and
d. purging unreacted silicon-containing precursor;
wherein the process is a plasma-enhanced process.

In accordance with another embodiment, the present invention relates to a process to deposit silicon oxide or carbon-doped silicon oxide on a substrate in a processing chamber, comprising:

a. contacting the substrate with an oxygen-containing source to absorb at least a portion of the oxygen-containing source on the substrate;
b. purging unabsorbed oxygen-containing source;
c. contacting the substrate with a silicon-containing precursor to react with the portion of the absorbed oxygen-containing source; and
d. purging unreacted silicon-containing precursor.

In accordance with another embodiment, he present invention relates to a process to deposit silicon oxynitride or carbon-doped silicon oxynitride on a substrate in a processing chamber, comprising:

a. contacting the substrate with a mixture of an oxygen-containing source and a nitrogen-containing source to absorb at least a portion of the oxygen-containing source and at least a portion of the nitrogen-containing source on the substrate;
b. purging unabsorbed oxygen-containing source and nitrogen-containing source;
c. contacting the substrate with a silicon-containing precursor to react with the portion of the absorbed oxygen-containing source and nitrogen-containing source; and
d. purging unreacted silicon-containing precursor.

The process in the above embodiments is preferably a plasma enhanced process, such as plasma enhanced atomic layer deposition(PEALD), plasma enhanced chemical vapor deposition(PECVD), and plasma enhanced cyclic chemical vapor deposition. The plasma is an in-situ generated plasma or a remotely generated plasma.

DETAILED DESCRIPTION OF THE INVENTION

Figure 1:
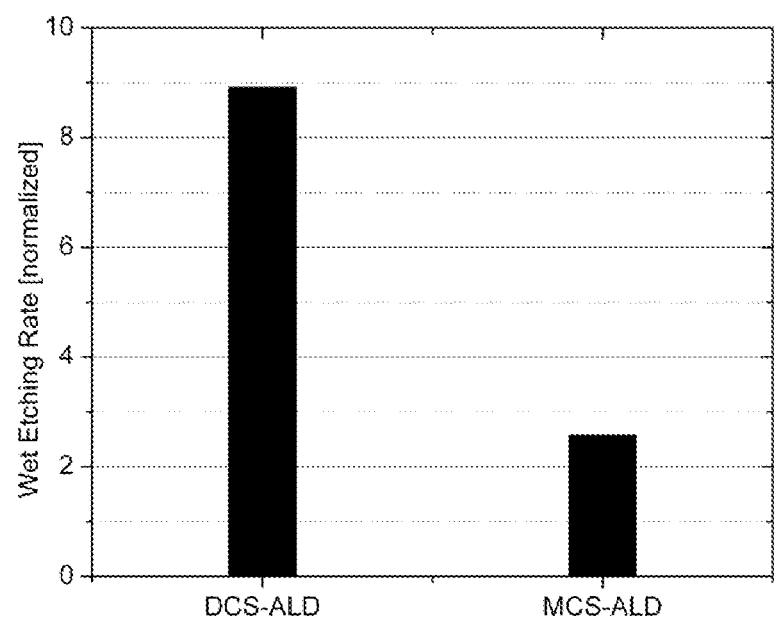
FIG. 1 provides the comparative data of wet etching rates of silicon nitride films deposited via PEALD using Monochlorosilane(MCS) and Dichlorosilane(DCS).

This invention is to address the issue of forming silicon nitride, silicon oxynitride, silicon oxide, carbon-doped silicon nitride, carbon-doped silicon oxide and carbon-doped oxynitride films at low deposition temperatures.

Dichlorosilane(DCS) has been widely used in the semiconductor industries as silicon source to deposit silicon nitride via reacting with ammonia. The typical deposition temperatures are greater than 550° C. and the by-products are two moles of HCl per DCS. The present invention uses monochlorosilane(MCS) to replace DCS to lower down the deposition temperatures as well as chloride contamination in the resulting films.

TABLE I

| Reaction | | DE (kcal/mol) |
|---|---|---|
| $H_3SiCl + NH_2\bullet \rightarrow H_3SiNH_2 + Cl\bullet$ | (1) | 6.755 |
| $H_3SiCl + NH_2\bullet \rightarrow H_2SiClNH_2 + H\bullet$ | (2) | −16.757 |
| $H_3SiCl + NH_2\bullet \rightarrow H_3SiNH\bullet + HCl$ | (3) | 39.742 |
| $H_3SiCl + NH_2\bullet \rightarrow H_2SiClNH\bullet + H_2$ | (4) | 20.208 |
| $H_2SiCl_2 + NH_2\bullet \rightarrow H_2SiClNH_2 + Cl\bullet$ | (5) | 2.05 |
| $H_2SiCl_2 + NH_2\bullet \rightarrow HSiCl_2NH_2 + H\bullet$ | (6) | −16.498 |
| $H_2SiCl_2 + NH_2\bullet \rightarrow H_2SiClNH\bullet + HCl$ | (7) | 36.801 |
| $H_2SiCl_2 + NH_2\bullet \rightarrow HSiCl_2NH\bullet + H_2$ | (8) | 20.445 |
| $H_2SiClNH_2 + NH_2\bullet \rightarrow H_2Si(NH_2)_2 + Cl\bullet$ | (9) | 7.222 |
| $H_2SiClNH_2 + NH_2\bullet \rightarrow HSiCl(NH_2)_2 + H\bullet$ | (10) | −17.077 |
| $H_2SiClNH_2 + NH_2\bullet \rightarrow H_2Si(NH_2)(NH\bullet) + HCl$ | (11) | 41.821 |
| $H_2SiClNH_2 + NH_2\bullet \rightarrow HSiCl(NH_2)(NH\bullet) + H_2$ | (12) | 20.178 |
| $HSiCl_2NH_2 + NH_2\bullet \rightarrow HSiCl(NH_2)_2 + Cl\bullet$ | (13) | 1.471 |
| $HSiCl_2NH_2 + NH_2\bullet \rightarrow SiCl_2(NH_2)_2 + H\bullet$ | (14) | −19.099 |
| $HSiCl_2NH_2 + NH_2\bullet \rightarrow HSiCl(NH_2)(NH\bullet) + HCl$ | (15) | 36.512 |
| $HSiCl_2NH_2 + NH_2\bullet \rightarrow SiCl_2(NH_2)(NH\bullet) + H_2$ | (16) | 18.346 |

To understand the cyclic chemical vapor deposition or atomic layer deposition processes of the reactions for DCS and monochlorosilane under ammonia plasma, quantum mechanical calculations were conducted using spin-polarized density functional theory with the PW91 exchange-correlation functional. A double numerical atomic orbital basis set augmented with polarization functions was utilized to represent the electronic structures of the molecular species. The ground state molecular structures were obtained upon full geometry optimization. The calculated thermochemicalenergies for various reactions of DCS or MCS with $NH_2$. radicals generated under ammonia plasma, are shown in Table I.

From the calculated data shown in Table I, it is clear that for reactions with ammonia plasma, to thermochemically break the Si—H bonds (reactions 2, 6, 10), the chemical processes are moderately exothermic. However, to break the Si—Cl bonds via ammonia plasma, the reactions (reactions 1, 5, 9) are all endothermic. It is much easier to break the Si—H bond than the Si—Cl bond for reactions with ammonia plasma, suggesting that the $NH_2$. radicals would react with the —$SiH_3$ fragments anchored on the semi-fabricated substrate via reacting MCS with the surface of the substrate much easier than the —$SiH_2Cl$ fragments anchored by DCS. As a result, the ALD reaction temperatures as well as the chloride contamination can be reduced.

WORKING EXAMPLE

Silicon Nitride Film

In this working example, a silicon oxide film has been deposited by using the following steps.

Substrates to be deposited films on were loaded to a hot wall atomic layer deposition (ALD) reactor. The reactor was flashed with Ar and pumped down to low pressure of less than 0.1 Torr(T) and heated up to a temperature at which film deposition was performed.

MCS (monochlorosilane) as the Si precursor was introduced to the reactor at a fixed flow rate. The reactor was saturated with MCS for a short fixed time (typically 10 seconds), and then pumped down to 0.1 T, followed by introducing a fixed flow of $NH_3$. The reactor was again pumped down after $NH_3$ precursor saturation for a short fixed time (typically 20 seconds). This cycle is repeated until desired film thickness is achieved.

The plasma power was set at approximately 100 W, and the temperature was set at approximately 450° C.

The plasma can be a nitrogen plasma, a mixture of nitrogen and hydrogen plasma, or a mixture of nitrogen and argon. The plasma can be generated in-situ plasma or remotely. The MCS can also be plasma-excited.

FIG. 1 provides the comparative data of wet etching rates of silicon nitride films deposited via PEALD. FIG. 1 shows PEALD film from Monochrosilane (MCS) is much more etching resistant than that of DCS.

Figure 2:
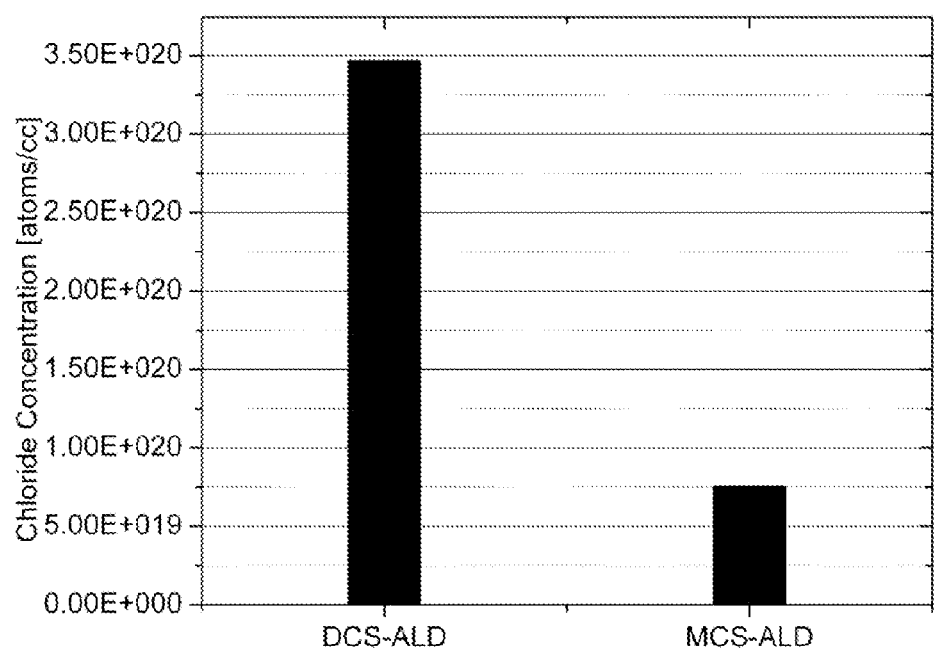
FIG. 2 provides the comparative data of chloride concentrations analyzed by Secondary Ion Mass Spectroscopy (SIMS) for the ALD silicon nitride films deposited at 450° C. under ammonia plasma, using Monochlorosilane(MCS) and Dichlorosilane(DCS).

FIG. 2 provides the comparative data of chloride concentrations analyzed by SIMS for the ALD silicon nitride films deposited at 450° C. under ammonia plasma. FIG. 2 suggests MCS gives lower chloride content, or lower chloride contamination.

Embodiment 1

Silicon Oxide Film

In this embodiment, a method of forming silicon oxide films comprises the following steps.

Substrates to be deposited films on are loaded to a hot wall CVD or ALD reactor. The reactor is flashed with Ar and pumped down to low pressure of less than 2 Torr(T) and heated up to a temperature at which film deposition is performed.

For CVD process, a fixed flow rate of MCS (monochlorosilane) as the Si precursor is introduced to the reactor. A fixed flow of a fixed flow of ozone as oxygen precursor is introduced to the reactor at the same time as MCS. The flow stops and then the deposition process stops when a desired film thickness is reached.

For ALD or cyclic CVD process, a fixed flow rate of MCS (monochlorosilane) as the Si precursor is introduced to the reactor. The reactor is saturated with MCS for a short fixed time (typical less than 10 seconds), and then pumped down to 2T, followed by introducing a fixed flow of ozone, or a plasma excited $O_2$. The reactor is again pumped down after N precursor saturation for a short fixed time (typical less than 10 seconds). This cycle is repeated until desired film thickness is achieved.

The process is preferably a plasma enhanced process, such as plasma enhanced atomic layer deposition, plasma enhanced chemical vapor deposition, and plasma enhanced cyclic chemical vapor deposition. The plasma is an in-situ generated plasma or a remotely generated plasma.

The deposition process is carried out at temperature at or below 550° C.

Embodiment 2

Silicon Oxynitride Film

In this embodiment, a method of forming silicon oxynitride films comprises the following steps.

Substrates to be deposited films on are loaded to a hot wall CVD or ALD reactor. The reactor is flashed with Ar and pumped down to low pressure of less than 2T and heated up to a temperature at which film deposition is performed;

For CVD process, a fixed flow rate of MCS (monochlorosilane) as the Si precursor is introduced to the reactor. A fixed flow of nitrogen source such as $NH_3$ and a fixed flow of $O_2$ as oxygen precursor are introduced to the reactor at the same time as MCS. The flow stops and then the deposition process stops when a desired film thickness is reached.

For ALD or cyclic CVD process, a fixed flow rate of MCS (monochlorosilane) as the Si precursor is introduced to the reactor. The reactor is saturated with MCS for a short fixed time (typical less than 10 seconds), and then pumped down to 2T, followed by introducing a fixed flow of $O_2$ as oxygen precursor and a fixed flow of $NH_3$. The reactor is again pumped down after N precursor saturation for a short fixed time (typical less than 10 seconds). This cycle is repeated until desired film thickness is achieved.

The process is preferably a plasma enhanced process, such as plasma enhanced atomic layer deposition, plasma enhanced chemical vapor deposition, and plasma enhanced cyclic chemical vapor deposition. The plasma is an in-situ generated plasma or a remotely generated plasma.

The deposition process is carried out at temperature at or below 550° C.

Embodiment 3

Carbon-Doped Silicon Nitride Film

In this embodiment, a method of forming carbon-doped silicon nitride films comprises the following steps.

Substrates to be deposited films on are loaded to a hot wall CVD or ALD reactor. The reactor is flashed with Ar and pumped down to low pressure of less than 2T and heated up to a temperature at which film deposition is performed;

For CVD process, a fixed flow rate of monochloroalkylsilane having a general formula of $ClSiH_xR^1{}_nR^2{}_{m-x}$ wherein x=1, 2; m=1, 2, 3; n=0, 1, n+m=<3; $R^1$ and $R^2$ are linear, branched or cyclic independently selected from the group consisting of alkyl, alkenyl, alkynyl, aryl having 1-10 carbon atoms; as a Si precursor is introduced to the reactor. A fixed flow of nitrogen source such as $NH_3$ is introduced to the reactor at the same time as monochloroalkylsilane. The flow stops and then the deposition process stops when a desired film thickness is reached.

The process is preferably a plasma enhanced process, such as plasma enhanced atomic layer deposition, plasma enhanced chemical vapor deposition, and plasma enhanced cyclic chemical vapor deposition. The plasma is an in-situ generated plasma or a remotely generated plasma.

For ALD or cyclic CVD process, a fixed flow rate of the Si precursor disclosed above, is introduced to the reactor. The reactor is saturated with the Si precursor for a short fixed time (typical less than 10 seconds), and then pumped down to 2T, followed by introducing a fixed flow of $NH_3$. The reactor is again pumped down after N precursor saturation for a short fixed time (typical less than 10 seconds). This cycle is repeated until desired film thickness is achieved.

Examples of monochloroalkylsilane are $ClSiMeH_2$, $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$.

The deposition process is carried out at temperature at or below 550° C.

Embodiment 4

Carbon-Doped Silicon Oxide Film

In this embodiment, a method of forming carbon doped silicon oxide films comprises the following steps.

Substrates to be deposited films on are loaded to a hot wall CVD or ALD reactor. The reactor is flashed with Ar and pumped down to low pressure of less than 2T and heated up to a temperature at which film deposition is performed;

For CVD process, a fixed flow rate of monochloroalkylsilane having a general formula of $ClSiH_xR^1{}_nR^2{}_{m-x}$ wherein x=1, 2; m=1, 2, 3; n=0, 1, n+m=<3; $R^1$ and $R^2$ are linear, branched or cyclic independently selected from the group consisting of alkyl, alkenyl, alkynyl, aryl having 1-10 carbon atoms; as Si precursor is introduced to the reactor. A fixed flow of oxygen source such as ozone is introduced to the reactor at the same time as the Si precursor. The flow stops and then the deposition process stops when a desired film thickness is reached.

The process is preferably a plasma enhanced process, such as plasma enhanced atomic layer deposition, plasma enhanced chemical vapor deposition, and plasma enhanced cyclic chemical vapor deposition. The plasma is an in-situ generated plasma or a remotely generated plasma.

For ALD or cyclic CVD process, a fixed flow rate of the Si precursor disclosed above is introduced to the reactor. The reactor is saturated with the Si precursor for a short fixed time (typical less than 10 seconds), and then pumped down to 2T, followed by introducing a fixed flow of ozone. The reactor is again pumped down after N precursor saturation for a short fixed time (typical less than 10 seconds). This cycle is repeated until desired film thickness is achieved.

Examples of monochloroalkylsilane are $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$.

The deposition process is carried out at temperature at or below 550° C.

Embodiment 5

Carbon-Doped Silicon Oxynitride Film

In this embodiment, a method of forming carbon-doped silicon oxynitride films comprises the following steps.

Substrates to be deposited films on are loaded to a hot wall CVD or ALD reactor. The reactor is flashed with Ar and pumped down to low pressure of less than 2T and heated up to a temperature at which film deposition is performed;

For CVD process, a fixed flow rate of monochloroalkylsilane having a general formula of $ClSiH_xR^1{}_nR^2{}_{m-x}$ wherein x=1, 2; m=1, 2, 3; n=0, 1, n+m=<3; $R^1$ and $R^2$ are linear, branched or cyclic independently selected from the group consisting of alkyl, alkenyl, alkynyl, aryl having 1-10 carbon atoms; as Si precursor is introduced to the reactor. A fixed flow of nitrogen source such as $NH_3$ and a fixed flow of $O_2$ as oxygen precursor are introduced to the reactor at the same time as the Si precursor. The flow stops and then the deposition process stops when a desired film thickness is reached.

For ALD or cyclic CVD process, a fixed flow rate of the Si precursor disclosed above is introduced to the reactor. The reactor is saturated with the Si precursor for a short fixed time (typical less than 10 seconds), and then pumped down to 2T, followed by introducing a fixed flow of ozone. The reactor is again pumped down after N precursor saturation for a short fixed time (typical less than 10 seconds). This cycle is repeated until desired film thickness is achieved.

The process is preferably a plasma enhanced process, such as plasma enhanced atomic layer deposition, plasma enhanced chemical vapor deposition, and plasma enhanced cyclic chemical vapor deposition. The plasma is an in-situ generated plasma or a remotely generated plasma.

Examples of monochloroalkylsilane are $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$.

The deposition process is carried out at temperature at or below 550° C.

The working example and embodiments of this invention listed above, are exemplary of numerous embodiments that may be made of this invention. It is contemplated that numerous other configurations of the process may be used, and the materials used in the process may be elected from numerous materials other than those specifically disclosed.

What is claimed is:

1. A process to deposit silicon nitride or carbon-doped silicon nitride on a substrate in a processing chamber, comprising:
   a. contacting the substrate with a nitrogen-containing source to absorb at least a portion of the nitrogen-containing source on the substrate;
   b. purging unabsorbed nitrogen-containing source;
   c. contacting the substrate with a silicon-containing precursor to react with the portion of the absorbed nitrogen-containing source; and
   d. purging unreacted silicon-containing precursor;
   wherein the process is a plasma-enhanced process; and
   the silicon-containing precursor is monochloroalkylsilane having a general formula of $ClSiH_xR^1{}_nR^2{}_{m-x}$ wherein x=1, 2; m=1, 2, 3; n=0, 1, n+m=<3; $R^1$ is linear, branched or cyclic independently selected from the group consisting of alkyl, alkenyl, alkynyl, and aryl having 1-10 carbon atoms and $R_2$ is linear, branched or cyclic independently selected from the group consisting of alkyl, alkenyl, alkynyl, and aryl having 2-10 carbon atoms and wherein the silicon-containing precursor in is selected from the group consisting of $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$, and mixtures thereof.

2. The process of claim 1 comprises plasma enhanced atomic layer deposition wherein the plasma is selected from the group consisting of an ammonia plasma, a nitrogen plasma, a mixture of nitrogen and hydrogen plasma, and a mixture of nitrogen and argon plasma; plasma-excited silicon precursor is optional.

3. The process of claim 2, wherein the plasma is an in-situ generated plasma or a remotely generated plasma.

4. The process of claim 1 wherein the nitrogen-containing source for depositing silicon nitride is selected from the group consisting of nitrogen, ammonia, hydrazine, monoalkylhydrozine, dialkylhydrozine, and mixture thereof; and the nitrogen-containing source for depositing carbon-doped silicon nitride is selected from the group consisting of nitrogen, ammonia, hydrazine, monoalkylhydrozine, dialkylhydrozine, hydroxylamine ($NH_2OH$), tert-butylamine ($NH_2C(CH_3)_3$), allylamine ($NH_2CH_2CHCH_2$), hydroxylamine hydrochloride, methylamine, diethylamine, triethylamine and mixture thereof.

5. A process to deposit silicon oxide or carbon-doped silicon oxide on a substrate in a processing chamber, comprising:
   a. contacting the substrate with an oxygen-containing source to absorb at least a portion of the oxygen-containing source on the substrate;
   b. purging unabsorbed oxygen-containing source;
   c. contacting the substrate with a silicon-containing precursor to react with the portion of the absorbed oxygen-containing source; and
   d. purging unreacted silicon-containing precursor;
   wherein the silicon-containing precursor is monochloroalkylsilane having a general formula of $ClSiH_xR^1{}_nR^2{}_{m-x}$ wherein x=1, 2; m=1, 2, 3; n=0, 1, n+m=<3; $R^1$ is linear, branched or cyclic independently selected from the group consisting of alkyl, alkenyl, alkynyl, and aryl having 1-10 carbon atoms and $R^2$ is linear, branched or cyclic independently selected from the group consisting of alkyl, alkenyl, alkynyl, and aryl having 2-10 carbon atoms and wherein the silicon-containing precursor is selected from the group consisting of $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$, and mixtures thereof.

6. The process of claim 5 is selected from the group consisting of plasma enhanced atomic layer deposition and plasma enhanced cyclic chemical vapor deposition.

7. The process of claim 6, wherein the plasma is an in-situ generated plasma or a remotely generated plasma.

8. The process of claim 5 wherein the oxygen-containing source is selected from the group consisting of oxygen, water, nitrous oxide, ozone, and mixture thereof.

9. A process to deposit silicon oxynitride or carbon-doped silicon oxynitride on a substrate in a processing chamber, comprising:
   a. contacting the substrate with a mixture of an oxygen-containing source and a nitrogen-containing source to absorb at least a portion of the oxygen-containing source and at least a portion of the nitrogen-containing source on the substrate;
   b. purging unabsorbed oxygen-containing source and nitrogen-containing source;
   c. contacting the substrate with a silicon-containing precursor to react with the portion of the absorbed oxygen-containing source and nitrogen-containing source; and
   d. purging unreacted silicon-containing precursor
   wherein the silicon-containing precursor is monochloroalkylsilane having a general formula of $ClSiH_xR^1{}_nR^2{}_{m-x}$ wherein x=1, 2; m=1, 2, 3; n=0, 1, n+m=<3; $R^1$ is linear, branched or cyclic independently selected from the group consisting of alkyl, alkenyl, alkynyl, and aryl having 1-10 carbon atoms and $R^2$ is linear, branched or cyclic independently selected from the group consisting of alkyl, alkenyl, alkynyl, and aryl having 2-10 carbon atoms and wherein the silicon-containing precursor in is selected from the group consisting of $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$, and mixtures thereof.

10. The process of claim 9 is selected from the group consisting of plasma enhanced atomic layer deposition and plasma enhanced cyclic chemical vapor deposition.

11. The process of claim 10, wherein the plasma is an in-situ generated plasma or a remotely generated plasma.

12. The process of claim 9 wherein the oxygen-containing source is selected from the group consisting of oxygen, water, nitrous oxide, ozone, and mixture thereof.

13. The process of claim 9 wherein the nitrogen-containing source is selected from the group consisting of nitrogen, ammonia, hydrazine, monoalkylhydrozine, dialkylhydrozine, hydroxylamine ($NH_2OH$), tert-butylamine ($NH_2C$ ($CH_3)_3$), allylamine ($NH_2CH_2CHCH_2$), hydroxylamine hydrochloride, methylamine, diethylamine, triethylamine and mixture thereof.

14. A process to deposit a film selected from the group consisting of a silicon oxide film, a silicon oxynitride film, a carbon-doped silicon oxide, and a carbon-doped silicon oxynitride film, on a substrate in a processing chamber, comprising:
   a. contacting the substrate with a mixture comprising an oxygen-containing source and optionally a nitrogen-containing source to absorb at least a portion of the oxygen-containing source and optional nitrogen-containing source on the substrate;
   b. purging unabsorbed oxygen-containing source and optional nitrogen-containing source;
   c. contacting the substrate with a silicon-containing precursor to react with the portion of the absorbed oxygen-containing source wherein the silicon-containing precursor comprises at least one selected from the group consisting of $ClSiEtH_2$, $ClSiEt_2H$, $ClSi(CH=CH_2)H_2$, $ClSi(CH=CH_2)MeH$, $ClSi(CH=CH_2)EtH$, $ClSi(CCH)H_2$, $ClSi(iso-Pr)_2H$, $ClSi(sec-Bu)_2H$, $ClSi(tert-Bu)_2H$, $ClSi(iso-Pr)H_2$, $ClSi(sec-Bu)H_2$, $ClSi(tert-Bu)H_2$, and mixtures thereof; and
   d. purging unreacted silicon-containing precursor wherein steps a through d are repeated until a desired thickness of the film is obtained.

15. The method of claim 14 wherein the mixture comprises the nitrogen-containing source.

16. The method of claim 15 wherein the nitrogen-containing source is selected from the group consisting of nitrogen, ammonia, hydrazine, monoalkylhydrozine, dialkylhydrozine, hydroxylamine ($NH_2OH$), tert-butylamine ($NH_2C(CH_3)_3$), allylamine ($NH_2CH_2CHCH_2$), hydroxylamine hydrochloride, methylamine, diethylamine, triethylamine and mixture thereof.

* * * * *

UNITED STATES PATENT AND TRADEMARK OFFICE
CERTIFICATE OF CORRECTION

| | |
|---|---|
| PATENT NO. | : 8,906,455 B2 |
| APPLICATION NO. | : 13/624190 |
| DATED | : December 9, 2014 |
| INVENTOR(S) | : Liu Yang et al. |

It is certified that error appears in the above-identified patent and that said Letters Patent is hereby corrected as shown below:

In the Claims

Column 7, Line 37
In claim 1 delete the word "in"

Column 8, Line 50
In claim 9 delete the word "in"

Signed and Sealed this
Fourteenth Day of July, 2015

Michelle K. Lee
*Director of the United States Patent and Trademark Office*